(12) United States Patent
Hioka

(10) Patent No.: US 10,971,678 B2
(45) Date of Patent: Apr. 6, 2021

(54) SEMICONDUCTOR DEVICE

(71) Applicant: ABLIC Inc., Chiba (JP)

(72) Inventor: Takaaki Hioka, Chiba (JP)

(73) Assignee: ABLIC INC., Chiba (JP)

( * ) Notice: Subject to any disclaimer, the term of this patent is extended or adjusted under 35 U.S.C. 154(b) by 49 days.

(21) Appl. No.: 16/390,813

(22) Filed: Apr. 22, 2019

(65) Prior Publication Data

US 2019/0326507 A1    Oct. 24, 2019

(30) Foreign Application Priority Data

Apr. 24, 2018  (JP) .............................. JP2018-083375

(51) Int. Cl.
```
H01L 43/06      (2006.01)
G01R 33/07      (2006.01)
H01L 43/04      (2006.01)
H01L 27/22      (2006.01)
```

(52) U.S. Cl.
CPC .......... H01L 43/065 (2013.01); G01R 33/072 (2013.01); G01R 33/077 (2013.01); H01L 43/04 (2013.01); H01L 27/22 (2013.01)

(58) Field of Classification Search
CPC ..... G01R 33/072; G01R 33/077; H01L 43/04; H01L 43/065; H01L 27/22
See application file for complete search history.

(56) References Cited

U.S. PATENT DOCUMENTS

| | | | | |
|---|---|---|---|---|
| 4,673,964 A | * | 6/1987 | Popovic | ................ H01L 27/22 257/427 |
| 4,929,993 A | * | 5/1990 | Popovic | ................ H01L 43/065 257/424 |
| 2006/0097715 A1 | * | 5/2006 | Oohira | ................ H01L 27/22 324/207.2 |

(Continued)

FOREIGN PATENT DOCUMENTS

| | | |
|---|---|---|
| DE | 102006017910 A1 | 10/2007 |
| EP | 3373351 A1 | 9/2018 |
| JP | 5966060 B2 | 7/2016 |

OTHER PUBLICATIONS

Extended European Search Report for Europe Application No. 19170859.3, dated Oct. 17, 2019, 9 pages.

(Continued)

*Primary Examiner* — Vongsavanh Sengdara
(74) *Attorney, Agent, or Firm* — Brinks Gilson & Lione

(57) ABSTRACT

A semiconductor device includes a first and a second vertical Hall elements formed parallel to each other. Each of the first and the second vertical Hall elements includes: a semiconductor layer on the semiconductor substrate; a Hall voltage output electrode and a first and a second drive current supply electrodes each formed of an impurity region, and sequentially arranged along a straight line on the semiconductor layer; and a first electrode isolation diffusion layer between the first drive current supply electrode and the Hall voltage output electrode, and a second electrode isolation diffusion layer between the Hall voltage output electrode and the (Continued)

second drive current supply electrode. The first and the second drive current supply electrodes each has the second depth deeper than the first depth of the Hall voltage output electrode and the depth of each of the electrode isolation diffusion layers.

10 Claims, 6 Drawing Sheets

(56) References Cited

U.S. PATENT DOCUMENTS

| | | | | |
|---|---|---|---|---|
| 2009/0256559 | A1* | 10/2009 | Ausserlechner | G01R 33/066 324/251 |
| 2010/0164483 | A1* | 7/2010 | Namai | G01R 33/07 324/207.2 |
| 2013/0021026 | A1* | 1/2013 | Ausserlechner | G01R 33/07 324/251 |
| 2013/0021027 | A1* | 1/2013 | Ausserlechner | G01R 33/075 324/251 |
| 2013/0214775 | A1* | 8/2013 | Ausserlechner | G01R 33/077 324/251 |
| 2013/0342194 | A1* | 12/2013 | Motz | G01R 33/077 324/251 |
| 2013/0342195 | A1* | 12/2013 | Ausserlechner | G01R 33/07 324/251 |
| 2013/0342196 | A1* | 12/2013 | Ausserlechner | H01L 43/065 324/251 |
| 2014/0210023 | A1* | 7/2014 | Wang | G01R 33/0052 257/421 |
| 2014/0264667 | A1* | 9/2014 | Wang | G01R 33/077 257/421 |
| 2015/0323613 | A1* | 11/2015 | Ausserlechner | G01R 33/07 324/251 |
| 2015/0323614 | A1* | 11/2015 | Ausserlechner | G01R 33/077 324/251 |
| 2016/0018478 | A1* | 1/2016 | Hebert | G01R 33/077 257/421 |
| 2016/0146906 | A1* | 5/2016 | Suzuki | G01R 33/075 257/424 |

OTHER PUBLICATIONS

Xu et al., "A Low-offset Vertical Hall Device With a Couple of Three-contact Vertical Hall Elements", 2016 13$^{th}$ IEEE International Conference on Solid-State and Integrated Circuit Technology (ICSICT), IEEE, Oct. 25, 2016, pp. 677-679, XP033134961.

* cited by examiner

SEMICONDUCTOR DEVICE

RELATED APPLICATIONS

This application claims priority under 35 U.S.C. § 119 to Japanese Patent Application No. 2018-083375 filed on Apr. 24, 2018, the entire content of which is hereby incorporated by reference.

BACKGROUND OF THE INVENTION

1. Field of the Invention

The present invention relates to a semiconductor device, and more particularly, to a semiconductor device that includes a vertical Hall element configured to detect a magnetic field in a horizontal direction.

2. Description of the Related Art

A Hall element is capable of detecting position or angle without contact as a magnetic sensor, and accordingly has various uses. While magnetic sensors that use a horizontal Hall element for detection of magnetic field components perpendicular to a semiconductor substrate surface (vertical magnetic field) are particularly well known, there have been proposed various magnetic sensors that use a vertical Hall element for detection of magnetic field components parallel to a substrate surface (horizontal magnetic field).

A vertical Hall element generally detects a horizontal magnetic field by utilizing both of a current that flows in a direction perpendicular to a substrate and a current that flows in a direction parallel to the substrate.

Meanwhile, in recent years, there has been proposed the following vertical Hall element which is disclosed in Japanese Patent No. 5966060, for example. In the vertical Hall element, a current that flows in a direction perpendicular to a surface of the substrate is reduced while a current that flows in a direction parallel to the surface of the substrate is increased, and the vertical Hall element is configured to detect a horizontal magnetic field by positively utilizing the increased current in the direction parallel to the surface of the substrate.

The vertical Hall element disclosed in Japanese Patent No. 5966060 includes trenches formed in the semiconductor substrate, an insulating film formed on the inner side surface of each of the trenches, a conductor embedded in each of the trenches via the insulating film, and a high-impurity-concentration contact region connected to the conductor and formed in the bottom portion of each of the trenches. The conductor embedded in each of the trenches and the contact region connected thereto function as a drive current supply electrode.

In such a configuration, when a current is supplied between two drive current supply electrodes, the current flows between the contact regions formed in the bottom portions of the trenches. Hence, this configuration can almost completely eliminate current components in the direction perpendicular to the surface of the substrate and allow most of the current to flow in the direction parallel to the surface of the substrate.

As described above, when a current is supplied between the two drive current supply electrodes, most of the current flows in the direction parallel to the surface of the substrate. The current concentrates, in particular, along the shortest path between the contact regions in the semiconductor substrate which constitutes a magnetism sensing portion. This means that almost no current flows to regions of the magnetism sensing portion that are located below the contact regions and are near the rear surface of the substrate. Further, the insulating film is formed on the inner side surface of the trench in which the conductor of the drive current supply electrode is embedded, and hence the current hardly flows to a region of the magnetism sensing portion that is located between the side walls of the two trenches. As a result, the current that flows in the direction parallel to the substrate has a small width in a depth direction of the substrate.

It is known that the magnetic sensitivity of a Hall element rises in proportion to the width of a current that flows through the Hall element. In the structure disclosed in Japanese Patent No. 5966060, however, the width of the current that flows in the direction parallel to the substrate is small as described above, and as a result, the sensitivity is only slightly improved.

Further, a Hall element is known to output a so-called offset voltage even when no magnetic field is applied to. Removal of the offset voltage is required in the use of the Hall element as a magnetic sensor.

In order to remove the offset voltage (to perform offset cancellation) in a vertical Hall element by a spinning current method which is known as an offset voltage removal method, the role of a plurality of electrodes arranged on a straight line needs to be alternately switched for use between a drive current supply electrode and a Hall voltage output electrode, and the direction of the current should also be switched.

However, in the structure of Japanese Patent No. 5966060, as described above, while the drive current supply electrode includes the conductor embedded in the trench via the insulating film and the contact region connected to the bottom portion of the trench, the Hall voltage output electrode includes the contact region formed in the surface of the semiconductor substrate.

In case the alternate switching between the role of the drive current supply electrode and the role of the Hall voltage output electrode is applied in this configuration, between the two alternated drive current supply electrodes which are the contact regions formed in the surface of the semiconductor substrate, there exists the trench portion of the alternated Hall voltage output electrode which includes the conductor embedded in the trench via the insulating film and the contact region connected to the bottom portion of the trench.

Even if it is attempted to flow a current between the control electrodes, which are drive current supply electrodes after alternation in this case, in the surface of the semiconductor substrate, the flow of the current is blocked by the insulating film in the trench since the insulating film is formed on the inner side surface of the trench. Hence it is quite difficult to perform offset cancellation in the structure of Japanese Patent No. 5966060 by the spinning current method.

SUMMARY OF THE INVENTION

It is therefore an object of the present invention to provide a semiconductor device including a vertical Hall element which is improved in sensitivity obtained by a current that flows in a direction parallel to a surface of a substrate, and which is capable of performing offset cancellation by a spinning current method.

In one embodiment of the present invention there is provided a semiconductor device including: a semiconductor substrate having a first conductivity; and a first vertical Hall element and a second vertical Hall element which are formed on the semiconductor substrate, each of the first vertical Hall element and the second vertical Hall element including: a semiconductor layer having a second conductivity formed on the semiconductor substrate; a first drive current supply electrode, a Hall voltage output electrode, and a second drive current supply electrode each of which is formed of an impurity region having the second conductivity and having an impurity concentration higher than an impurity concentration of the semiconductor layer, and is sequentially arranged along a straight line on a surface of the semiconductor layer; and a first electrode isolation diffusion layer having the first conductivity formed between the first drive current supply electrode and the Hall voltage output electrode, and a second electrode isolation diffusion layer having the first conductivity formed between the Hall voltage output electrode and the second drive current supply electrode, the straight line on the first vertical Hall element and the straight line on the second vertical Hall element being parallel, the Hall voltage output electrode having a first depth, each of the first drive current supply electrode and the second drive current supply electrode having a second depth which is deeper than the first depth and a depth of each of the first electrode isolation diffusion layer and the second electrode isolation diffusion layer.

According to the present invention, in each of the first vertical Hall element and the second vertical Hall element, the first drive current supply electrode and the second drive current supply electrode are formed deeper than the Hall voltage output electrode and the electrode isolation diffusion layers in the semiconductor layer. Accordingly, the current between the first drive current supply electrode and the second drive current supply electrode flows in a direction parallel to the surface of the substrate, and flows widely in a depth direction in the semiconductor layer, that is, in an entire region between bottom portions of the electrode isolation diffusion layers and bottom portions of the first drive current supply electrode and the second drive current supply electrode.

The magnetic sensitivity of both of the first vertical Hall element and the second vertical Hall element can thus be enhanced. The first vertical Hall element and the second vertical Hall element as above are formed parallel to each other on the same semiconductor substrate, and hence the spinning current method can be performed equivalently by appropriately switching a direction of the current flowing in the first vertical Hall element and a direction of the current flowing in the second vertical Hall element, and an offset voltage can be eliminated.

DETAILED DESCRIPTION OF THE PREFERRED EMBODIMENTS

The invention will now be described herein with reference to illustrative embodiments.

First Embodiment

Figure 1A:
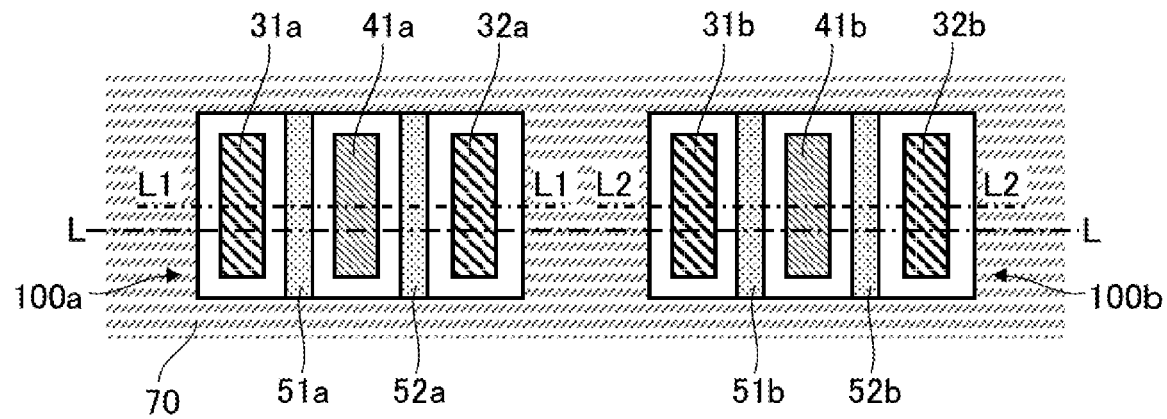
FIG. 1A is a plan view for illustrating a semiconductor device according to a first embodiment of the present invention.
Figure 1B:
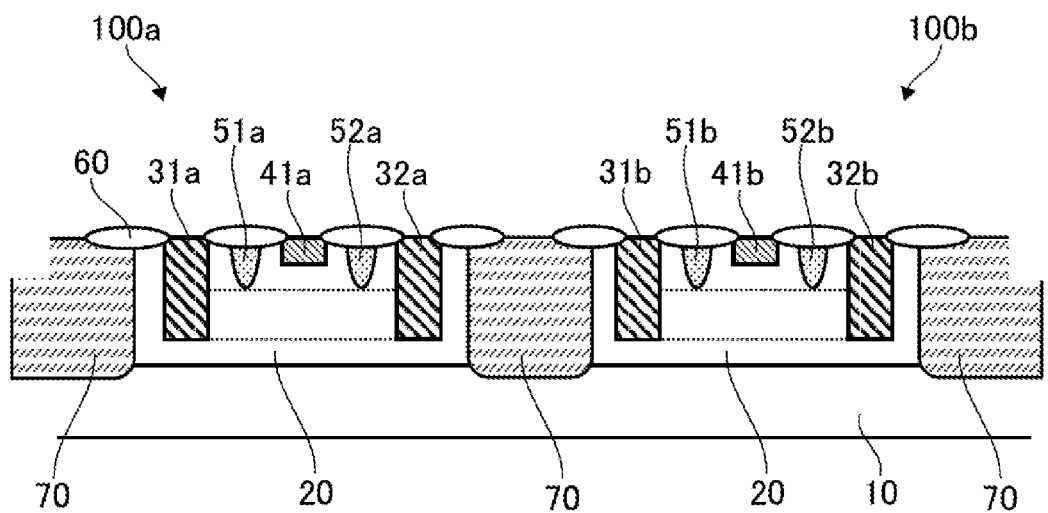
FIG. 1B is a sectional view taken along the line L-L of FIG. 1A.

FIG. 1A and FIG. 1B are views for illustrating a semiconductor device 1 according to the first embodiment of the present invention. FIG. 1A is a plan view of the semiconductor device 1, and FIG. 1B is a sectional view taken along the line L-L of FIG. 1A.

As illustrated in FIG. 1, the semiconductor device 1 of the first embodiment includes a P-type (first conductivity) semiconductor substrate 10, vertical Hall elements 100a and 100b formed on the semiconductor substrate 10, and a P-type element isolation diffusion layer 70 formed to surround the vertical Hall elements 100a and 100b and to separate the vertical Hall element 100a and the vertical Hall element 100b from each other.

The vertical Hall element 100a includes, on a surface of an N-type (second conductivity) semiconductor layer 20 formed on the semiconductor substrate 10, a drive current supply electrode 31a, a Hall voltage output electrode 41a, and a drive current supply electrode 32a which are formed of an N-type impurity region having an impurity concentration higher than an impurity concentration of the semiconductor layer 20 and are formed sequentially along the straight line L1-L1, and includes, on the surface of the semiconductor layer 20, a P-type electrode isolation diffusion layer 51a formed between the drive current supply electrode 31a and the Hall voltage output electrode 41a and a P-type electrode isolation diffusion layer 52a formed between the Hall voltage output electrode 41a and the drive current supply electrode 32a to separate the adjacent electrodes.

The vertical Hall element 100b is formed to have the same shape as that of the vertical Hall element 100a on the semiconductor substrate 10. That is, the vertical Hall element 100b includes, on a surface of a semiconductor layer 20, a drive current supply electrode 31b, a Hall voltage output electrode 41b, and a drive current supply electrode 32b which are made of an N-type impurity region and are formed sequentially along the straight line L2-L2, and includes, on the surface of the semiconductor layer 20, a P-type electrode isolation diffusion layer 51b formed between the drive current supply electrode 31b and the Hall voltage output electrode 41b and a P-type electrode isolation diffusion layer 52b formed between the Hall voltage output electrode 41b and the drive current supply electrode 32b to separate the adjacent electrodes.

The vertical Hall element 100a and the vertical Hall element 100b are arranged such that the straight line L1-L1 is parallel to the straight line L2-L2.

The drive current supply electrodes 31a, 32a, 31b, and 32b are formed to have a depth that is larger than those of the Hall voltage output electrodes 41a and 41b and the electrode isolation diffusion layers 51a, 52a, 51b, and 52b.

Further, the drive current supply electrodes 31a, 32a, 31b, and 32b have an impurity concentration that is substantially equal to an impurity concentration of the Hall voltage output electrodes 41a and 41b.

The vertical Hall elements 100a and 100b further include an insulating film 60 such as an $SiO_2$ film so as to cover a surface of the N-type semiconductor layer 20, except for regions in which the drive current supply electrodes 31a, 32a, 31b, and 32b, and the Hall voltage output electrodes 41a and 41b are formed, permitting suppression of a current that flows in parallel to the surface of the semiconductor substrate 10 on the surface of the semiconductor layer 20.

The element isolation diffusion layer 70 is formed deeper than the bottom of the semiconductor layer 20 and to reach the semiconductor substrate 10. As a result, the vertical Hall element 100a and the vertical Hall element 100b are electrically separated from each other and are separated from another region (not shown) on the semiconductor substrate 10.

Elements such as a transistor forming a circuit configured to process output signals from the vertical Hall elements 100a and 100b or configured to supply signals to the vertical Hall elements 100a and 100b are also formed in the region (not shown) separated by the element isolation diffusion layer 70. In FIG. 1A, for example, the region may be formed between the vertical Hall element 100a and the vertical Hall element 100b.

Further, in the first embodiment, there is illustrated an example in which the vertical Hall element 100a and the vertical Hall element 100b are arranged side by side in the drawing sheets, but the arrangement is not limited thereto. The vertical Hall element 100a and the vertical Hall element 100b may be arranged arbitrarily as long as the straight Line L1-L1 is parallel to the straight Line L2-L2, for example, being arranged vertically.

In the vertical Hall elements 100a and 100b, the P-type electrode isolation diffusion layers 51a, 52a, 51b, and 52b are formed by, for example, selective diffusion of P-type impurities into the N-type semiconductor layer 20.

Further, the drive current supply electrodes 31a, 32a, 31b, and 32b and the Hall voltage output electrodes 41a and 41b are formed as follows, for example.

First, after the electrode isolation diffusion layers 51a, 52a, 51b, and 52b are formed, the insulating film 60 is formed through LOCOS, for example, so that the insulating film 60 covers the electrode isolation diffusion layers 51a, 52a, 51b, and 52b while leaving regions in which the drive current supply electrodes 31a, 32a, 31b, and 32b, and the Hall voltage output electrodes 41a and 41b are formed later. Introducing N-type impurities with the insulating film 60 used as a mask, the Hall voltage output electrodes 41a and 41b are formed. At this time, N-type impurity regions that have the same depth as those of the Hall voltage output electrodes 41a and 41b are also formed in the regions in which the drive current supply electrodes 31a, 32a, 31b, and 32b are formed later. In this case, the Hall voltage output electrodes 41a and 41b are formed to have a depth that is shallower than the depth of the electrode isolation diffusion layers 51a, 52a, 51b, and 52b.

Subsequently, a resist having openings in the regions in which the drive current supply electrodes 31a, 32a, 31b, and 32b are formed and covering the Hall voltage output electrodes 41a and 41b is formed. The drive current supply electrodes 31a, 32a, 31b, and 32b are then formed after introducing N-type impurities deeply with the resist used as a mask.

Next, a method of offset cancellation by the spinning current method is described with reference to FIG. 1A, FIG. 1B, and FIG. 2 under a condition that the vertical Hall elements 100a and 100b of the semiconductor device 1 of the first embodiment detects magnetic field components in a direction parallel to the surface of the semiconductor substrate 10.

In FIG. 1B, a magnetic field is applied from the far side to the near side on the drawing sheet in the direction parallel to the semiconductor substrate 10.

Figure 2:
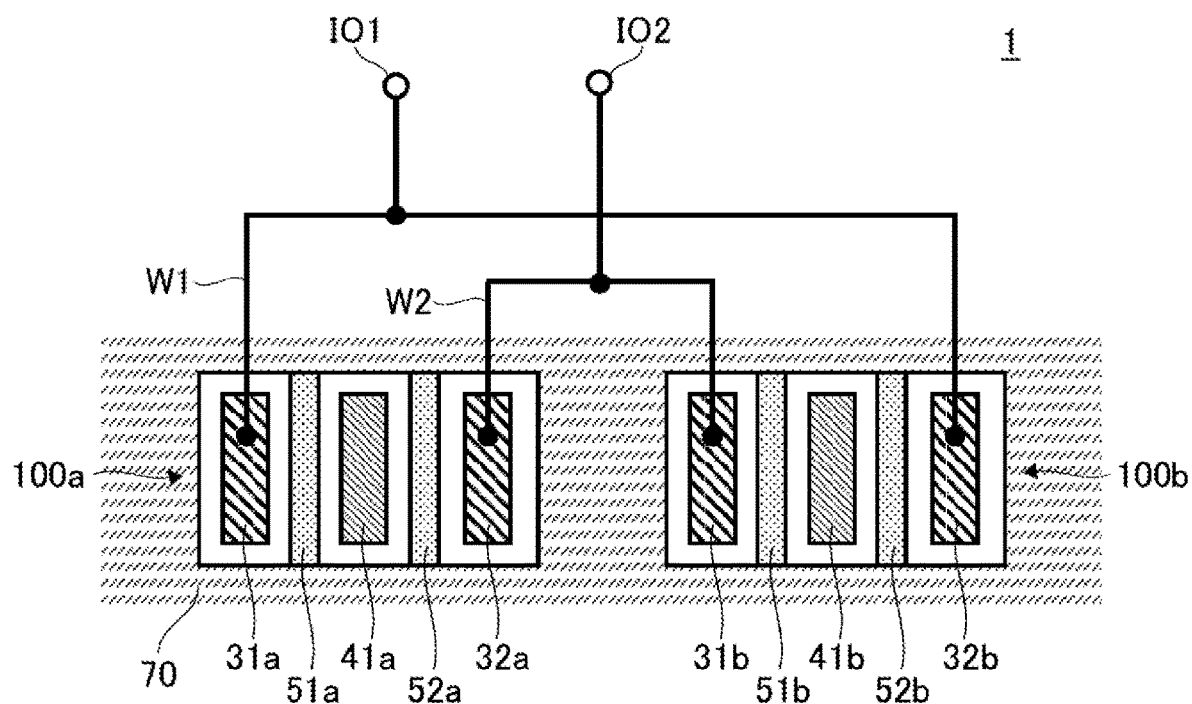
FIG. 2 is a schematic view for illustrating an operation of the semiconductor device illustrated in FIG. 1A and FIG. 1B.

As illustrated in FIG. 2, the drive current supply electrode 31a of the vertical Hall element 100a and the drive current supply electrode 32b of the vertical Hall element 100b are electrically connected by a conductive interconnect W1 to connect to an input and output terminal I01. The drive current supply electrode 32a of the vertical Hall element 100a and the drive current supply electrode 31b of the vertical Hall element 100b are electrically connected by a conductive interconnect W2 to connect to an input and output terminal I02.

The spinning current method in the semiconductor device 1 including the vertical Hall elements 100a and 100b configured in this manner is performed as described below.

First, a drive current is supplied from the input and output terminal I01 to the input and output terminal I02. That is, the drive current is supplied to the drive current supply electrodes 31a and 32b such that the current flows from the drive current supply electrode 31a to the drive current supply electrode 32a in the vertical Hall element 100a, and such that the current flows from the drive current supply electrode 32b to the drive current supply electrode 31b in the vertical Hall element 100b (phase 1).

At this time, in the vertical Hall element 100a the current flows, as illustrated by the dotted lines of FIG. 1B, in a region between bottom portions of the electrode isolation diffusion layers 51a and 52a and bottom portions of the drive current supply electrodes 31a and 32a. In the vertical Hall element 100b the current flows in a region between bottom portions of the electrode isolation diffusion layers 51b and 52b and bottom portions of the drive current supply electrodes 31b and 32b. That is, the currents flow widely in a depth direction.

For each current flowing in this way an electromotive force generates in a direction perpendicular to both the current and the magnetic field due to the action of the magnetic field. That is, in the vertical Hall element 100a, a Lorentz force is generated in a direction from the Hall voltage output electrode 41a toward the semiconductor substrate 10 (downward) with respect to the current flowing in the direction parallel to the surface of the semiconductor substrate 10 from the drive current supply electrode 31a toward the drive current supply electrode 32a. Meanwhile, in the vertical Hall element 100b, a Lorentz force is generated in a direction opposite to the direction in the vertical Hall element 100a, that is, in a direction from the semiconductor substrate 10 toward the Hall voltage output electrode 41b (upward) with respect to the current flowing in the direction parallel to the surface of the semiconductor substrate 10 from the drive current supply electrode 32b toward the drive current supply electrode 31b.

Accordingly, an electric potential difference is generated between the Hall voltage output electrodes 41a and 41b. A magnetic field is detected based on the electric potential difference. The electric potential difference at this time is referred to as an output voltage Vout1 in the phase 1.

Then, the direction of the drive current is switched from the condition in the phase 1 to supply the drive current from the input and output terminal IO2 to the input and output terminal IO1. That is, the drive current is supplied to the drive current supply electrodes 32a and 31b such that the current flows from the drive current supply electrode 32a to the drive current supply electrode 31a in the vertical Hall element 100a, and such that the current flows from the drive current supply electrode 31b to the drive current supply electrode 32b in the vertical Hall element 100b (phase 2).

At this time, the currents respectively flowing in the vertical Hall elements 100a and 100b are, as with the phase 1, widely flow in the depth direction as illustrated by the dotted lines of FIG. 1B.

Then, in the vertical Hall element 100a, a Lorentz force is generated in a direction from the semiconductor substrate 10 toward the Hall voltage output electrode 41a (upward) with respect to the current flowing in the direction parallel to the surface of the semiconductor substrate 10 from the drive current supply electrode 32a toward the drive current supply electrode 31a. Meanwhile, in the vertical Hall element 100b, a Lorentz force is generated in a direction opposite to the direction in the vertical Hall element 100a, that is, in a direction from the Hall voltage output electrode 41b toward the semiconductor substrate 10 (downward) with respect to the current flowing in the direction parallel to the surface of the semiconductor substrate 10 from the drive current supply electrode 31b toward the drive current supply electrode 32b.

Accordingly, an electric potential difference is generated between the Hall voltage output electrodes 41a and 41b. A magnetic field is detected based on the electric potential difference. The electric potential difference at this time is referred to as an output voltage Vout2 in the phase 2.

A subtraction is performed between the output voltage Vout1 and the output voltage Vout2 obtained as described above to have a signal in which an offset voltage is canceled.

As described above, the first embodiment can increase the width in the depth direction of the current that flows in the direction parallel to the surface of the semiconductor substrate 10. Since the magnetic sensitivity of a Hall element is in proportion to the width of a current that flows in the Hall element, according to the first embodiment, high magnetic sensitivity can be obtained. The semiconductor layer 20 is hence preferably as thick as possible.

In the first embodiment, it is desired for the current to uniformly flow over the entire region illustrated by the dotted lines in FIG. 1B. It is thus preferable that the semiconductor layer 20 has a constant impurity concentration distribution. The constant impurity concentration distribution in the semiconductor layer 20 can be achieved by the employment of an epitaxial layer, for example.

In addition, the magnetic sensitivity of a Hall element is known to rise also in proportion to mobility. Thus, the impurity concentration of the N-type semiconductor layer 20 which is a magnetism sensing portion is preferably as low as possible and is preferably from about $1 \times 10^{15}$ atoms/cm$^3$ to about $1 \times 10^{17}$ atoms/cm$^3$, for example.

As described above, in the first embodiment, the width in the depth direction of the currents flowing in a direction parallel to the surface of the semiconductor substrate is widened to enable enhancement of magnetic sensitivity, and the two vertical Hall elements having the same shape are formed in parallel to allow the spinning current method to be performed equivalently on the two vertical Hall elements by using the two phases which supply currents flowing in opposite directions from each other. It is therefore possible to provide a semiconductor device including vertical Hall elements having high sensitivity and being capable of offset cancellation.

Figure 3:
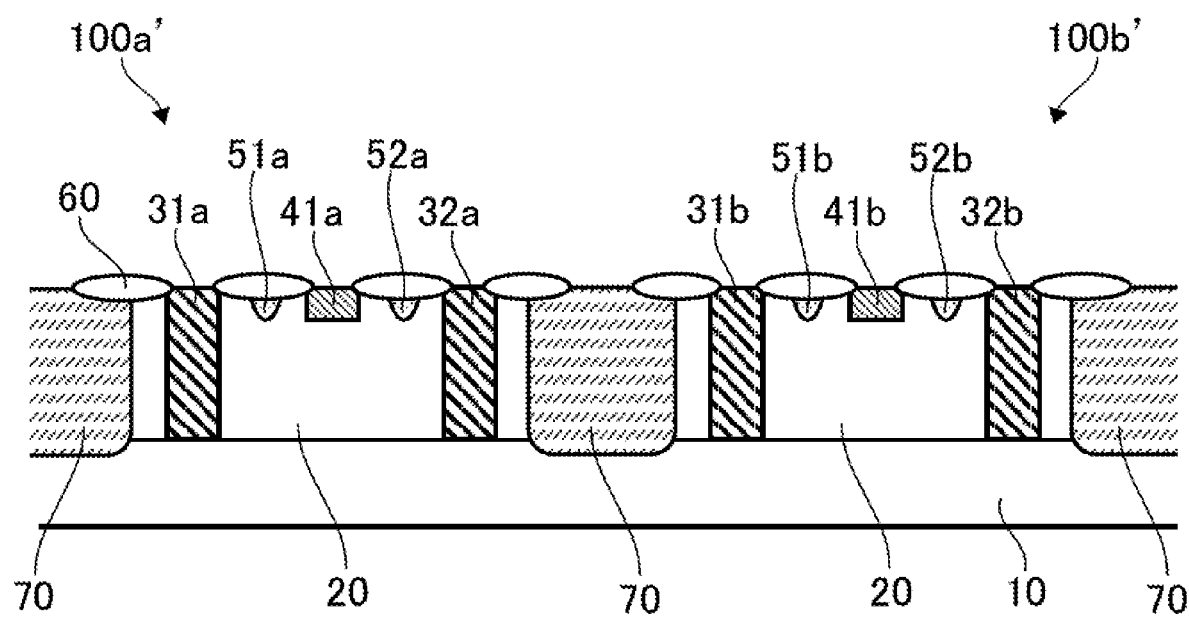
FIG. 3 is a sectional view taken along the line L-L of FIG. 1A for illustrating a first modification example of vertical Hall elements in the semiconductor device illustrated in FIG. 1A and FIG. 1B.

Next, the first modification example of the vertical Hall elements 100a and 100b in the semiconductor device 1 of the first embodiment is described. FIG. 3 is a sectional view for illustrating vertical Hall elements 100a' and 100b' of the first modification example taken along the line L-L of FIG. 1A.

As illustrated in FIG. 3, in the vertical Hall elements 100a' and 100b' of the first modification example, the drive current supply electrodes 31a, 32a, 31b, and 32b have a depth that is substantially equal to the depth of the semiconductor layer 20. This configuration allows a current to flow even near the boundary between the semiconductor layer 20 and the semiconductor substrate 10 and can achieve a large width in the depth direction of a current that flows in the direction parallel to the surface of the semiconductor substrate 10 as compared to the example illustrated in FIG. 1B.

In addition, in the first modification example, the electrode isolation diffusion layers 51a, 52a, 51b, and 52b have a depth that is substantially equal to the depth of the Hall voltage output electrodes 41a and 41b. This configuration allows a current to flow even near the Hall voltage output electrodes 41a and 41b and can achieve a larger width in the depth direction of a current.

That is, the drive current supply electrodes 31a, 32a, 31b, and 32b are preferably as deep as possible in the range of the thickness of the semiconductor layer 20, and the electrode isolation diffusion layers 51a, 52a, 51b, and 52b are preferably as shallow as possible in a range that enables electrode isolation.

As described above, according to the first modification example, the magnetic sensitivity can be more improved.

Figure 4:
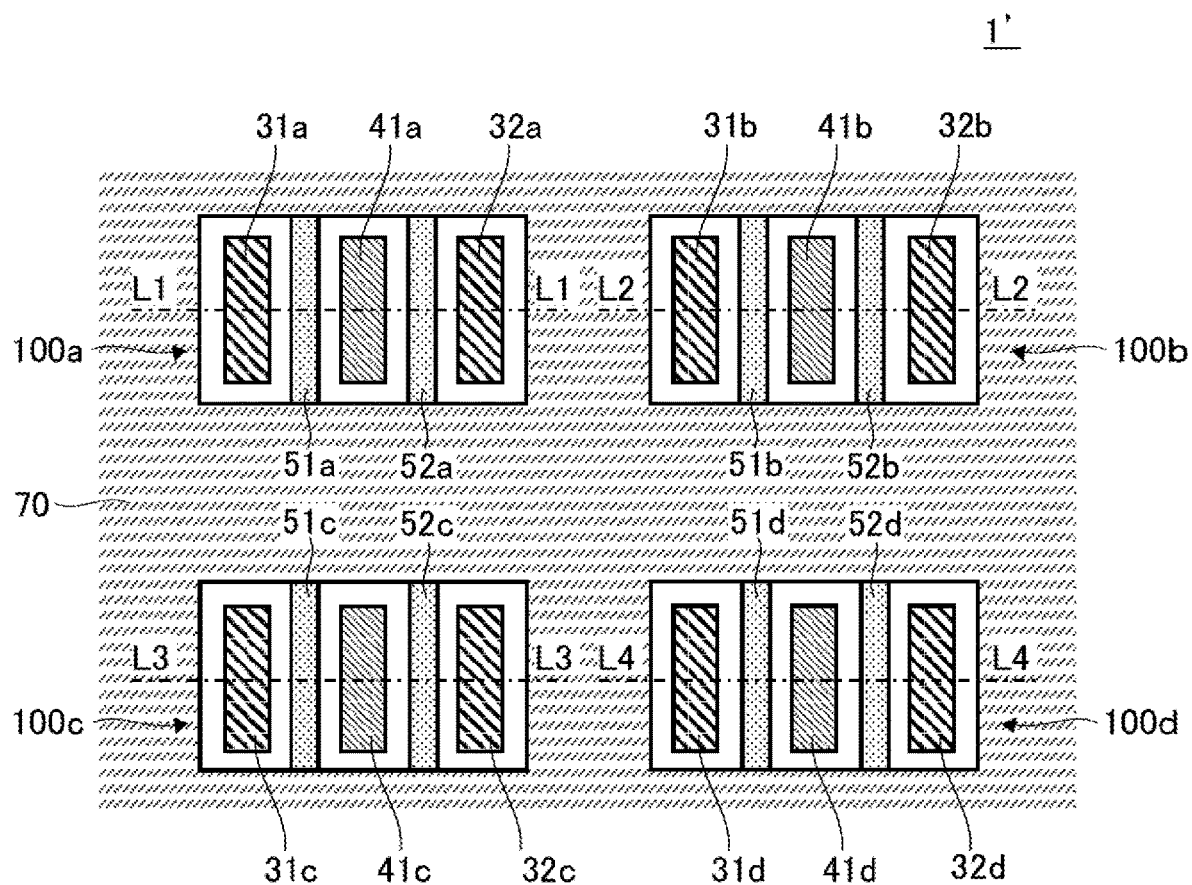
FIG. 4 is a plan view for illustrating a second modification example of the semiconductor device according to the first embodiment of the present invention.

Next, the second modification example of the semiconductor device 1 of the first embodiment is described. FIG. 4 is a plan view for illustrating a semiconductor device 1' of the second modification example.

The semiconductor device 1' according to the second modification example further includes, in addition to the semiconductor device 1 illustrated in FIG. 1, vertical Hall elements 100c and 100d. The vertical Hall elements 100c and 100d have the same shape as that of the vertical Hall elements 100a and 100b.

That is, the vertical Hall element 100c includes, on the surface of the semiconductor layer 20 (refer FIG. 1B), a drive current supply electrode 31c, a Hall voltage output electrode 41c, and a drive current supply electrode 32c each of which is formed of an N-type impurity region and is formed sequentially along the straight line L3-L3, and includes, on the surface of the semiconductor layer 20, a P-type electrode isolation diffusion layer 51c formed between the drive current supply electrode 31c and the Hall voltage output electrode 41c and a P-type electrode isolation diffusion layer 52c formed between the Hall voltage output electrode 41c and the drive current supply electrode 32c to separate the adjacent electrodes.

Further, the vertical Hall element 100d includes, on the surface of the semiconductor layer 20, a drive current supply electrode 31d, a Hall voltage output electrode 41d, and a drive current supply electrode 32d which are formed of an N-type impurity region and are formed sequentially along the straight line L4-L4, and includes, on the surface of the semiconductor layer 20, a P-type electrode isolation diffusion layer 51d formed between the drive current supply electrode 31d and the Hall voltage output electrode 41d and a P-type electrode isolation diffusion layer 52d formed between the Hall voltage output electrode 41d and the drive current supply electrode 32d to separate the adjacent electrodes.

Then, the vertical Hall element 100c and the vertical Hall element 100d are arranged such that the straight line L3-L3 and the straight line L4-L4 are parallel to the straight line L1-L1 and the straight line L2-L2.

The depth, the impurity concentration distribution, and the like of the drive current supply electrodes 31c, 32c, 31d, and 32d, the Hall voltage output electrodes 41c and 41d, and the electrode isolation diffusion layers 51c, 52c, 51d, and 52d in the vertical Hall devices 100c and 100d are the same as those in the vertical Hall elements 100a and 100b.

Offset cancellation through the spinning current method in the semiconductor device 1' of the second modification example configured as described above is performed, for example, as follows.

In the semiconductor device 1 described above, in the phase 1 in which the spinning current method is performed, the drive current is supplied to the drive current supply electrodes 31c and 32d such that the current flows from the drive current supply electrode 31c to the drive current supply electrode 32c in the vertical Hall element 100c, and such that the current flows from the drive current supply electrode 32d to the drive current supply electrode 31d in the vertical Hall element 100d. At this time, an electric potential difference generated between the Hall voltage output electrodes 41c and 41d is referred to as an output voltage Vout1', and an average between the output voltage Vout1 described above and the output voltage Vout1' is calculated.

Further, in the phase 2 described above, the drive current is supplied to the drive current supply electrodes 32c and 31d such that the current flows from the drive current supply electrode 32c to the drive current supply electrode 31c in the vertical Hall element 100c, and such that the current flows from the drive current supply electrode 31d to the drive current supply electrode 32d in the vertical Hall element 100d. At this time, an electric potential difference generated between the Hall voltage output electrodes 41c and 41d is referred to as an output voltage Vout2', and an average between the output voltage Vout2 described above and the output voltage Vout2' is calculated.

A subtraction is performed between the average of the output voltages Vout1 and Vout1' and the average of the output voltages Vout2 and Vout2' obtained as described above to have a signal in which an offset voltage is canceled. The output signal in each phase is averaged, which can thus reduce an influence on the output voltage due to manufacturing variations of the vertical Hall elements 100a to 100d and can enhance accuracy of offset cancellation.

In this case of the acquisition of the output voltages Vout1 and Vout1' and the output voltages Vout2 and Vout2', the same drive source can be used for a drive source configured to supply the drive current to the vertical Hall elements 100a and 100b and a drive source configured to supply the drive current to the vertical Hall elements 100c and 100d. However, the present invention is not limited thereto, and the vertical Hall elements 100a and 100b may be driven by the first drive source and the vertical Hall elements 100c and 100d may be driven by the second drive source, or all of the vertical Hall elements 100a, 100b, 100c, and 100d may be driven by different drive sources, and the current magnitude of each drive source is appropriately adjusted so that an influence of variations and the like due to the semiconductor manufacturing processing can be reduced.

Instead of the combinations of the vertical Hall elements 100a and 100b and the vertical Hall elements 100c and 100d, a plurality of combinations may be switched to appropriately allow the drive current to flow so as to obtain a plurality of output voltages for calculation. As a result, more accurate offset cancellation can be achieved.

Further, in the second modification example, although there has been illustrated the example in which the semiconductor device 1' includes four vertical Hall elements 100a to 100d, more vertical Hall elements may be included to further enhance accuracy of offset cancellation.

Second Embodiment

In the first embodiment described above, the drive current supply electrodes 31a, 32a, 31b, and 32b have the impurity concentration that is substantially equal to the impurity concentration of the Hall voltage output electrodes 41a and 41b and have the depth that is different from that of the Hall voltage output electrodes 41a and 41b. In the second embodiment of the present invention, drive current supply electrodes have a configuration that is different from those of the drive current supply electrodes of the first embodiment described above.

For the purpose of easy understanding of the description, there is described an example in which the drive current supply electrodes 31a, 32a, 31b, and 32b of the semiconductor device of the first embodiment including the vertical Hall elements 100a and 100b, which is illustrated in FIG. 1A and FIG. 1B, are replaced with the drive current supply electrodes having the configuration in the second embodiment.

Figure 5A:
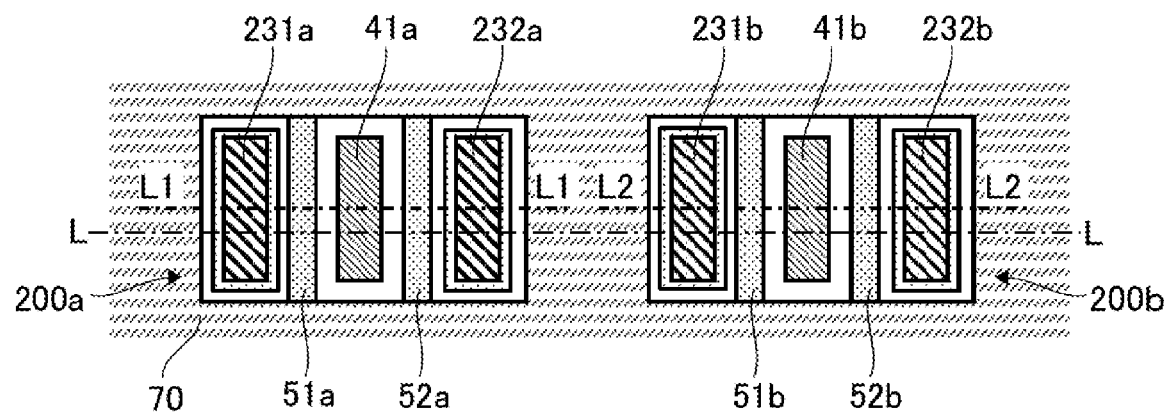
FIG. 5A is a plan view for illustrating a semiconductor device according to a second embodiment of the present invention.
Figure 5B:
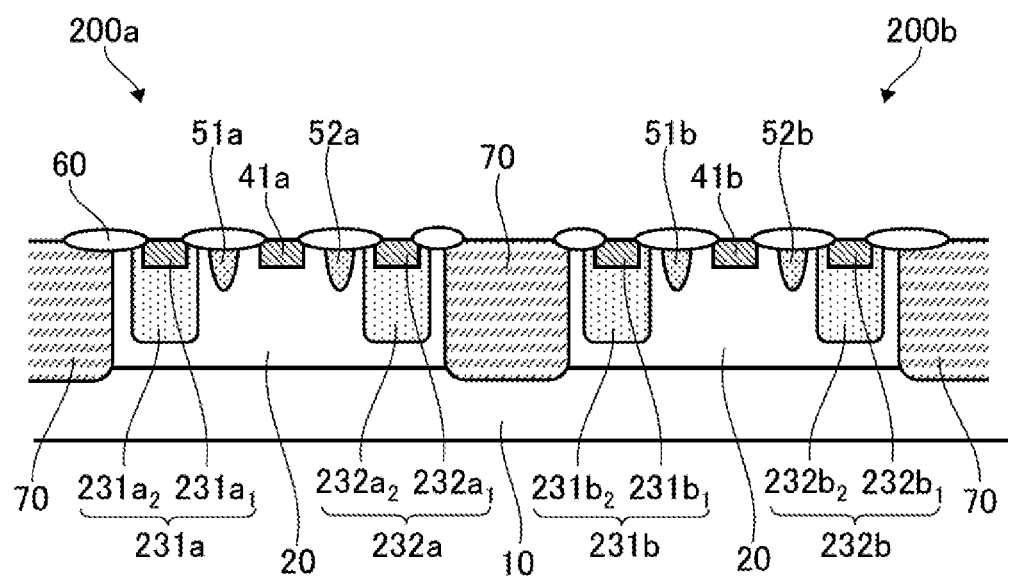
FIG. 5B is a sectional view taken along the line L-L of FIG. 5A.
Figure 6:
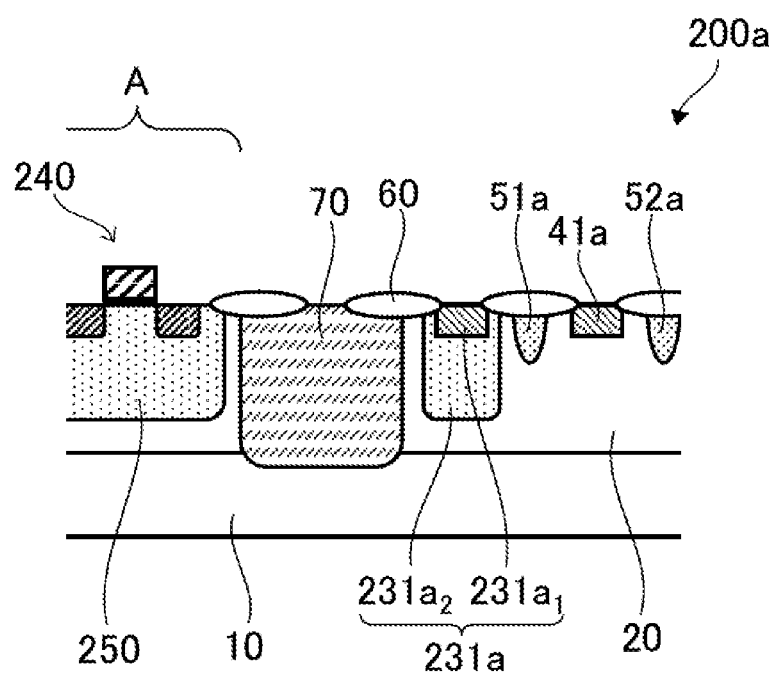
FIG. 6 is another sectional view taken along the line L-L of FIG. 5A.

FIG. 5A and FIG. 5B are views for illustrating a semiconductor device 2 including vertical Hall elements 200a and 200b according to the second embodiment of the present invention. FIG. 5A is a plan view of the semiconductor device 2, and FIG. 5B is a sectional view taken along the line L-L of FIG. 5A. FIG. 6 is another sectional view taken along the line L-L of FIG. 5A to illustrate a portion of the vertical Hall element 200a and a region A adjacent to the portion.

Components that are the same as those of the semiconductor device 1 that includes the vertical Hall element 100a and 100b illustrated in FIG. 1A and FIG. 1B are denoted by the same reference symbols, and duplicate descriptions are omitted as appropriate.

As illustrated in FIG. 5A and FIG. 5B, in the semiconductor device 2, the vertical Hall element 200a includes, instead of the drive current supply electrodes 31a and 32a in the vertical Hall element 100a illustrated in FIG. 1, drive current supply electrodes 231a and 232a, and the vertical Hall element 200b includes, instead of the drive current supply electrodes 31b and 32b in the vertical Hall element 100b illustrated in FIG. 1, drive current supply electrodes 231b and 232b. Other components of the semiconductor device 2 are the same as those of the semiconductor device 1.

The drive current supply electrodes $231a_1$, $232a_1$, $231b_1$, and $232b_1$ are formed of N-type impurity layers $231a_1$ and $231a_2$, $232a_1$ and $232a_2$, $231b_1$ and $231b_2$, and $232b_1$ and $232b_2$, respectively.

The N-type impurity layers $231a_1$, $232a_1$, $23b_1$, and $232b_1$ are formed in the surfaces of the N-type impurity layers $231a_2$, $232a_2$, $231b_2$, and $232b_2$, respectively, and have substantially the same impurity concentration and depth as those of the Hall voltage output electrodes 41a and 41b.

The N-type impurity layers $231a_2$, $232a_2$, $231b_2$, and $232b_2$ are formed to have a depth that is deeper than those of the Hall voltage output electrodes 41a and 41b and the electrode isolation diffusion layers 51a, 52a, 51b, and 52b. Further, the N-type impurity layers $231a_2$, $232a_2$, $231b_2$, and $232b_2$ have an impurity concentration lower than that of the N-type impurity layers $231a_1$, $232a_1$, $231b_1$, and $232b_1$ and have a width that is larger than that of the N-type impurity layers $231a_1$, $232a_1$, $231b_1$, and $232b_1$.

Meanwhile, as illustrated in FIG. 6, elements including transistors of a circuit for processing output signals from the vertical Hall elements 200a and 200b or supplying signals to the vertical Hall elements 200a and 200b are formed in another region A on the semiconductor substrate 10 which is electrically isolated from the vertical Hall elements 200a and 200b by the P-type element isolation diffusion layer 70. In the region A, at least one N-well 250 is formed in the semiconductor layer 20 to form the element described above, for example, a PMOS transistor 240.

With this configuration, the N-type impurity layers $231a_2$, $232a_2$, $231b_2$, and $232b_2$ can be formed through processes that are common to those of the N-well 250. The N-well 250 consequently has substantially the same depth and impurity concentration distribution as those of the N-type impurity layers $231a_2$, $232a_2$, $231b_2$, and $232b_2$.

Thus, according to the second embodiment, without increasing manufacturing processing, the drive current supply electrodes 231a, 232a, 231b, and 232b can be formed to include the N-type impurity layers $231a_1$ and $231a_1$, $232a_1$ and $232a_2$, $231b_1$ and $231b_2$, and $232b_1$ and $232b_2$, respectively.

The structure of the drive current supply electrodes illustrated in the second embodiment can be applied not only to the first embodiment illustrated in FIG. 1 but also to the first modification example of the first embodiment illustrated in FIG. 3. That is, the drive current supply electrodes 231a, 232a, 231b, and 232b in the second embodiment are, in order to further widen the width of the current in the depth direction, also preferred to be deeper as with the drive current supply electrodes 31a, 32a, 31b, and 32b in the first modification example of the first embodiment illustrated in FIG. 3, and are most preferred to be substantially as deep as the semiconductor layer 20. In this case, it is preferred that the N-type impurity layers $231a_2$, $232a_2$, $231b_2$, and $232b_2$ be formed to be deeper without changing the depth of the N-type impurity layers $231a_1$, $232a_1$, $231b_1$, and $232b_1$.

It is apparent that the present invention is not limited to the above embodiments and may be modified and changed without departing from the scope and spirit of the invention.

For example, the first conductivity and the second conductivity which are the P type and the N type, respectively, in the embodiments described above, may be switched to set the first conductivity as the N type and the second conductivity as the P type.

Further, in FIG. 2, in order to simplify the description, there has been described the example in which the drive current supply electrode 31a of the vertical Hall element 100a and the drive current supply electrode 32b of the vertical Hall element 100b are connected by the conductive interconnect W1, and the drive current supply electrode 32a of the vertical Hall element 100a and the drive current supply electrode 31b of the vertical Hall element 100b are connected by the conductive interconnect W2. However, the connections between the drive current supply electrodes are not necessarily fixed, and, for example, may be switched appropriately with a switch

The invention claimed is:

1. A semiconductor device, comprising:
a semiconductor substrate having a first conductivity; and
a first vertical Hall element and a second vertical Hall element which are formed on the semiconductor substrate,
each of the first vertical Hall element and the second vertical Hall element comprising:
a semiconductor layer having a second conductivity formed on the semiconductor substrate;
a first drive current supply electrode, a Hall voltage output electrode, and a second drive current supply electrode each of which is formed of an impurity region having the second conductivity and having an impurity concentration higher than an impurity concentration of the semiconductor layer, and is sequentially arranged along a straight line on a surface of the semiconductor layer; and
a first electrode isolation diffusion layer having the first conductivity formed between the first drive current supply electrode and the Hall voltage output electrode, and a second electrode isolation diffusion layer having the first conductivity formed between the Hall voltage output electrode and the second drive current supply electrode,
the straight line on the first vertical Hall element and the straight line on the second vertical Hall element being parallel,
the Hall voltage output electrode having a first depth,
each of the first drive current supply electrode and the second drive current supply electrode having a second depth which is deeper than the first depth and a depth of each of the first electrode isolation diffusion layer and the second electrode isolation diffusion layer.

2. The semiconductor device according to claim 1, wherein each of the first drive current supply electrode and the second drive current supply electrode has an impurity concentration that is substantially equal to the impurity concentration of the Hall voltage output electrode.

3. The semiconductor device according to claim 1, wherein each of the first drive current supply electrode and the second drive current supply electrode includes:
a first impurity layer having the second conductivity and having the second depth; and
a second impurity layer having the second conductivity, formed in a surface of the first impurity layer, and having the first depth and an impurity concentration higher than an impurity concentration of the first impurity layer.

4. The semiconductor device according to claim 3, wherein the second impurity layer has an impurity concentration that is substantially equal to the impurity concentration of the Hall voltage output electrode.

5. The semiconductor device according to claim 1, wherein each of the first electrode isolation diffusion layer and the second electrode isolation diffusion layer has a depth that is substantially equal to the first depth.

6. The semiconductor device according to claim 1, wherein each of the first drive current supply electrode and the second drive current supply electrode has a depth that is substantially equal to a depth of the semiconductor layer.

7. The semiconductor device according to claim 1, wherein the semiconductor layer includes an epitaxial layer.

8. The semiconductor device according to claim 1, wherein the surface of the semiconductor layer and surfaces of the first electrode isolation diffusion layer and the second electrode isolation diffusion layer are covered with an insulating film except for regions in which the first drive current supply electrode, the second drive current supply electrode, and the Hall voltage output electrode are formed.

9. The semiconductor device according to claim 1,
wherein the first drive current supply electrode of the first vertical Hall element and the second drive current supply electrode of the second vertical Hall element are electrically connected to each other, and
wherein the second drive current supply electrode of the first vertical Hall element and the first drive current supply electrode of the second vertical Hall element are electrically connected to each other.

10. The semiconductor device according to claim 3, further comprising:
an element isolation diffusion layer having the first conductivity which electrically separates the first vertical Hall element and the second vertical Hall element from each other, and which electrically separates the first vertical Hall element and the second vertical Hall element from surroundings; and
an element formation region which is electrically separated from the first vertical Hall element and the second vertical Hall element by the element isolation diffusion layer, and which is formed with an element that forms a circuit configured to perform one of: processing output signals from the first vertical Hall element and the second vertical Hall element; and supplying signals to the first vertical Hall element and the second vertical element,
wherein the element formation region includes a well having the second conductivity, and
wherein the well has substantially the same depth as a depth of the first impurity layer and has substantially the same impurity concentration distribution as an impurity concentration distribution of the first impurity layer.

* * * * *